(12) United States Patent
Gubbins et al.

(10) Patent No.: US 10,895,684 B2
(45) Date of Patent: Jan. 19, 2021

(54) INTEGRATED LASER TRANSCEIVER

(71) Applicant: Seagate Technology LLC, Cupertino, CA (US)

(72) Inventors: Mark A. Gubbins, Letterkenny (IE); Richard C. A. Pitwon, Fareham (GB); Aidan D. Goggin, Redcastle (IE); Marcus B. Mooney, Burnfoot (IE); Reyad Mehfuz, Londonderry (GB); Fadi El Hallak, Londonderry (GB); Paula F. McElhinney, Londonderry (GB); Brendan Lafferty, Muff (IE); Kelly E. Callan, Londonderry (GB)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/449,016

(22) Filed: Jun. 21, 2019

(65) Prior Publication Data

US 2020/0400884 A1   Dec. 24, 2020

(51) Int. Cl.
*G02B 6/12* (2006.01)
*G02B 6/132* (2006.01)
*H01S 5/22* (2006.01)
*H01S 5/062* (2006.01)

(52) U.S. Cl.
CPC ......... *G02B 6/12007* (2013.01); *G02B 6/132* (2013.01); *H01S 5/062* (2013.01); *H01S 5/2206* (2013.01); *G02B 2006/12061* (2013.01); *G02B 2006/12121* (2013.01); *G02B 2006/12142* (2013.01); *G02B 2006/12147* (2013.01)

(58) Field of Classification Search
CPC ........ G02B 6/12; G02B 6/4214; G02B 6/132; G02B 6/12007
See application file for complete search history.

(56) References Cited

U.S. PATENT DOCUMENTS

| 6,975,664 B1 * | 12/2005 | Dodabalapur | ........ H01S 3/0933 372/102 |
| 8,501,536 B2 | 8/2013 | Mooney et al. | |
| 8,578,555 B2 | 11/2013 | Conrad | |
| 8,753,974 B2 | 6/2014 | Griffin et al. | |
| 2004/0004217 A1 * | 1/2004 | Jayaraman | ................ H01S 5/12 257/53 |

OTHER PUBLICATIONS

Barwicz et al., "Low-Cost Interfacing of Fibers to Nanophotonic Waveguides: Design for Fabrication and Assembly Tolerances", IEEE Photonics Journal, vol. 6, No. 4, Aug. 2014, 19 pages.

(Continued)

*Primary Examiner* — Jennifer Doan
(74) *Attorney, Agent, or Firm* — Mueting Raasch Group

(57) ABSTRACT

A method, and apparatus provided thereby, includes providing a substrate and placing an integrated laser on the substrate. A first cladding layer surrounds the integrated laser and includes a laser optical coupler aligned with an output of the laser. The laser optical coupler includes silicon and the laser includes a III-V compound semiconductor. The output of the laser is spaced apart from the laser optical coupler by a gap of less than or equal to 500 nanometers. An optical waveguide is positioned on the first cladding layer and in optical communication with the laser optical coupler.

20 Claims, 6 Drawing Sheets

(56) References Cited

OTHER PUBLICATIONS

Barwicz et al., "Automated, self-aligned assembly of 12 fibers per nanophotonic chip with standard microelectronics assembly tooling", 2015 IEEE 65th Electronic Components and Technology Conference, ECTC 2015, Jul. 15, 2015, pp. 775-782.

Corbett et al., "Transfer print techniques for heterogeneous integration of photonic components", Progress in Quantum Electronics 52, 2017, pp. 1-17.

Lightcounting Market Research, "Integrated Optical Devices", May 2018. (no copy available).

Mekis et al., "Advanced Silicon Photonics Transceivers", 2017 European Conference on Optical Communication, Sep. 17-21, 2017.

Zhang et al., "Transfer-printing-based integration of III-V-on-silicon distributed feedback laser", Optics Express, vol. 36, No. 7, Apr. 2, 2018, 10 pages.

\* cited by examiner

INTEGRATED LASER TRANSCEIVER

The disclosure herein relates to a photonic integrated circuit that forms a transceiver and further to systems and the method of making such photonic integrated circuits.

SUMMARY

An illustrative apparatus may include a substrate, a III-V compound semiconductor laser, a first cladding layer, a laser optical coupler, and an optical waveguide. The III-V compound semiconductor laser may be positioned on the substrate and adapted to output optical signals. The first cladding layer may be positioned on the substrate and surrounding the integrated laser. The optical coupler may include silicon, may be positioned within the first cladding layer, and may be aligned with the integrated laser to receive the optical signals. The optical waveguide may be positioned on the first cladding layer and may be in optical communication with the laser optical coupler.

An illustrative system may include a printed circuit board, a photonic integrated circuit, and an optical fiber. The photonic integrated circuit may be operably coupled to the printed circuit board. The photonic integrated circuit may include a substrate, an integrated laser, a laser optical coupler, and an optical waveguide. The integrated laser may be mechanically placed on the substrate and adapted to output optical signals. The laser optical coupler may be aligned with the integrated laser to receive the optical signals and may be spaced apart from an output of the laser by a gap distance of less than or equal to 500 nanometers. The optical waveguide may be positioned in optical communication with the laser optical coupler. The optical fiber may be operably coupled to the photonic integrated circuit and in optical communication with the optical waveguide.

An illustrative method may include providing a substrate and placing a laser on the substrate. The method may also include depositing a first cladding layer on the substrate and surrounding the laser. The first cladding layer may include a laser optical coupler aligned with an output of the laser. Further, the method may include depositing an optical waveguide on the first cladding layer such that the optical waveguide is in optical communication with the laser optical coupler.

The above summary is not intended to describe each embodiment or every implementation of the present disclosure. A more complete understanding will become apparent and appreciated by referring to the following detailed description and claims taken in conjunction with the accompanying drawings. In other words, these and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings.

DETAILED DESCRIPTION

Figure 1:
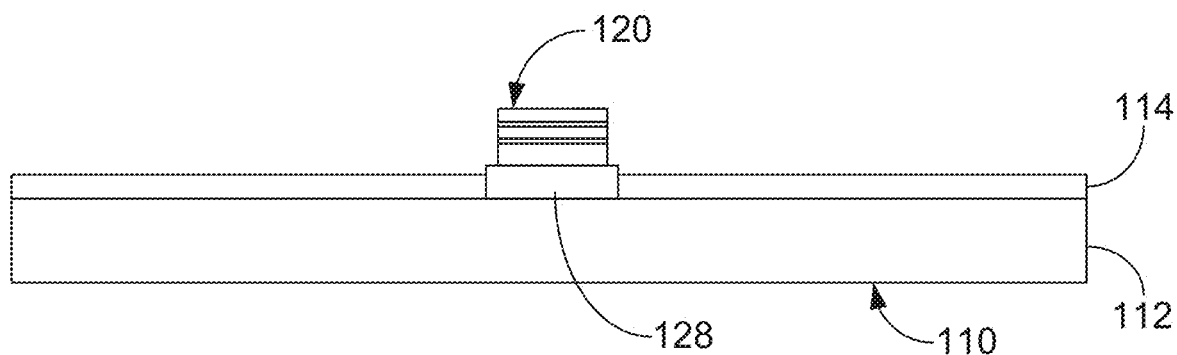
FIGS. 1-8 are cross-sectional schematic diagrams of an illustrative photonic integrated circuit throughout various stages of a photonic integrated circuit build process.

Exemplary systems, apparatus, and photonic integrated circuits shall be described with reference to FIGS. 1-10. It will be apparent to one skilled in the art that elements or processes from one embodiment may be used in combination with elements or processes of the other embodiments, and that the possible embodiments of such systems, apparatus, and photonic integrated circuits using combinations of features set forth herein is not limited to the specific embodiments shown in the figures and/or described herein. Further, it will be recognized that the size and shape of various elements herein may be modified but still fall within the scope of the present disclosure, although certain one or more shapes and/or sizes, or types of elements, may be advantageous over others.

The present disclosure relates to photonic integrated circuits that form transceivers. Generally, transceivers convert data between optical and electrical formats in various networks (e.g., data networks, telecom networks, etc.). In one or more embodiments, the photonic integrated circuit may include lasers, modulators, and detectors integrated into the circuit. The photonic integrated circuit may include wafer integration of these components (e.g., lasers, modulators, detectors, etc.) within the transceiver. Specifically, the integrated components may be transfer printed or mechanically placed within the photonic integrated circuit during fabrication of the photonic integrated circuit such that the integrated components may be described as being "built-in."

The lasers and modulators may operate to transmit optical signals over single or multiple channels in optical fibers. The photodetectors may operate to receive optical signals to be converted to electrical signals. The photonic integrated circuit may then be operably coupled to a printed circuit board and optical fibers to form the transceiver. As such, the transceiver may include optical connections and electrical connections to provide inputs/outputs for converting data between optical and electrical formats.

Further, the photonic integrated circuits may include an optical coupler adapted to couple optical signals output from the laser and into an optical waveguide of the photonic integrated circuit and another optical coupler adapted to couple optical signals from an optical fiber to the optical waveguide. In one or more embodiments, the optical couplers may include a specific graded index design to ensure efficient light coupling. For example, the optical couplers may include multiple layers ranging in refractive index.

Typically, transceivers do not include lasers, optical components, and control electronics integrated into the wafer level of the transceivers. Instead, for example, the lasers are often in a separate package that is attached to the transceiver after construction of the circuit. By integrating the laser, optical components, and control electronics within the photonic integrated circuit, the transceiver performance may increase.

Embodiments as described in this disclosure include the terms "placing" and "direct bonding." It is to be understood as used herein "placing" means mechanically moving and positioning an item to a place or location. For example, placing a laser on a substrate may include mechanically moving the laser to the substrate and also positioning the laser on the substrate. Two examples of "placing" an item such as, e.g., a laser, may be "pick and placing" and "transfer printing" as will be further described herein.

It is to be understood as used herein "direct bonding" is a wafer bonding process where a first layer or object is bonded to a second layer or object without adhesive or any intermediate layers between the first and second layers or objects. For example, a laser may be bonded to a surface of a substrate. When a laser is placed on a surface (e.g., on or in the substrate), a surface of the laser may be bonded to the surface of the substrate without the aid of adhesive. Thereby, a direct bond may be formed.

Reference will now be made to the drawings, which depict one or more aspects described in this disclosure. However, it will be understood that other aspects not depicted in the drawings fall within the scope and spirit of this disclosure. Like numbers used in the figures refer to like components, elements, portions, regions, openings, apertures, and the like. However, it will be understood that the use of a reference character to refer to an element in a given figure is not intended to limit the element in another figure labeled with the same reference character.

FIGS. 1-8 illustrate schematic diagrams of an illustrative photonic integrated circuit 100 throughout a photonic integrated circuit build process (e.g., method of manufacturing) according to one or more embodiments. As shown in FIG. 1, the photonic integrated circuit 100 may include a substrate 110. The substrate 110 may include a base layer 112 and a device layer 114. The substrate 110 may be provided using any suitable methods or techniques, e.g., deposition or growing processes, etc. Further, the substrate 110 may include (e.g., be formed of) one or more materials such as, e.g., silicon (e.g., silicon dioxide, silicon carbide), titanium carbide, gallium arsenide (GaAs), indium phosphide (InP), aluminum nitride (AlN), sapphire, diamond, etc. The substrate 110 may be any suitable size or shape. For example, the substrate 110 may define a depth or thickness of about 1 millimeter to about 5 millimeters. Specifically, the substrate 110 may define a depth or thickness of about 2 millimeters.

The base layer 112 (of the substrate 110) and the device layer 114 (of the substrate 110) may be provided using any suitable methods or techniques. For example, in one or more embodiments, the device layer 114 may be grown or deposited on the base layer 112. The base layer 112 and the device layer 114 may include (e.g., be formed of) the same or different materials, as described herein. Further, the base layer 112 may define a depth or thickness of about 0.5 millimeters to about 1.5 millimeters and the device layer 114 may define a depth or thickness of about 0.5 millimeters to about 1.5 millimeters.

The photonic integrated circuit 100 may also include a laser 120. The laser 120 may be placed or positioned (e.g., mechanically placed) on the substrate 110 by any suitable methods or processes. For example, placing the laser 120 on the substrate 110 may include using a "pick and place" method, a transfer printing method, etc.

In the "pick and place" method, the laser 120 may be provided (e.g., grown or deposited, fabricated, etc.) on a surface (e.g., a wafer) different from the substrate 110 and an apparatus may "pick up" or "grab" the laser 120 from the wafer, move and position the laser 120 relative to the substrate 110, and place the laser 120 onto the substrate 110 to be coupled thereon.

In the transfer printing method, placing the laser 120 on the substrate 110 may include transfer printing the laser 120 to the substrate 110. The laser 120 may be transfer printed on the substrate 110 in any suitable way, as is known in the art. For example, the transfer printing of at least one laser on sliders is described in U.S. Pat. No. 8,501,536 to Mooney et al., which is herein incorporated by reference in its entirety.

Figure 10:
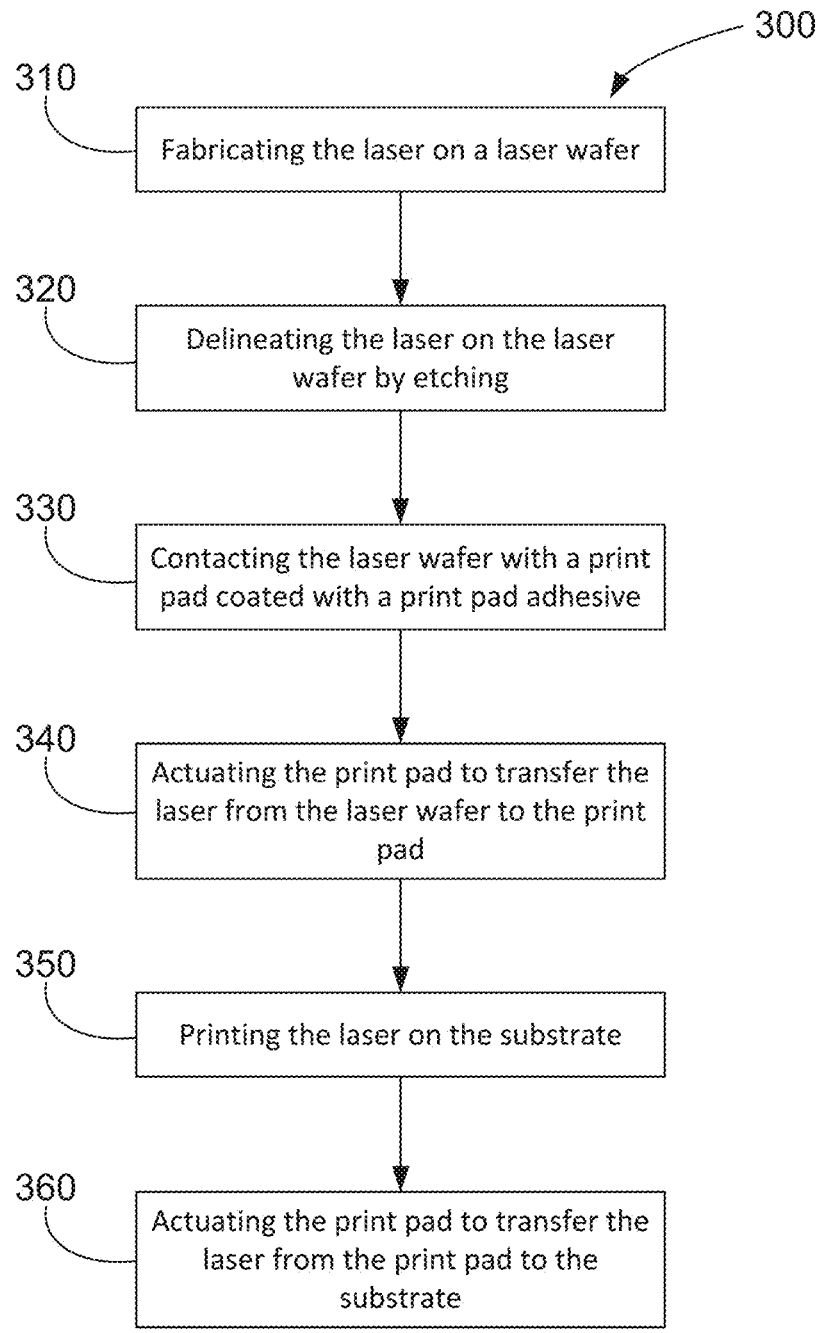
FIG. 10 is a block diagram of an illustrative method of transfer printing a laser from a laser wafer to a substrate.

An illustrative method 300 of transfer printing a laser from a laser wafer to a substrate is illustrated in FIG. 10. For example, the method 300 may include fabricating or providing 310 a laser (e.g., an array of lasers) on a laser wafer, e.g., before transferring the laser to the substrate. Further, the method 300 may include delineating 320 the laser on the laser wafer by etching and contacting 330 the laser wafer with a print pad (e.g., coated with a print pad adhesive). The method 300 may also include actuating 340 the print pad to transfer the laser from the laser wafer to the print pad. Additionally, the method 300 may include printing 350 the laser on the substrate and actuating 360 the print pad to transfer the laser from the print pad to the substrate. In one or more embodiments, the method 300 may include coating a surface of the substrate with an adhesive before printing 350 the laser on the substrate. In other embodiments, the laser may be printed or transferred on to the substrate using a direct bond between the laser and the substrate (e.g., without the use of an adhesive therebetween).

It is noted that the transfer printing process may include multiple lasers or an array of lasers that are fabricated and transfer printed to a substrate, which may then be separated into independent substrates to form photonic integrated circuits. Additionally, other optical components (e.g., modulators, photodetectors, etc.) may be fabricated and transfer printed in a similar fashion as the lasers described herein.

The laser 120 may include any of a variety of different types of lasers. For example, in one or more embodiments, the laser 120 may include Fabry-Perot lasers, Dual Bragg Reflector (DBR) lasers, Distributed Feedback (DFB) lasers etc. The laser 120 may define any suitable characteristics or specifications. For example, the laser 120 may define an output power of about 60 mW at 75° C. to about 100 mW at 75° C. Specifically, the laser 120 may define an output power of about 80 mW at 75° C. Further, for example, the laser 120 may operate at optical wavelengths of about 1300 nanometers to 1550 nanometers (e.g., for communications applications). In one or more embodiments, the laser 120 may include or be formed of any III-V compound semiconductors such as, e.g., gallium arsenide, indium phosphate, gallium phosphate, gallium nitride, etc. In other words, the laser 120 may be, or be referred to as, a III-V compound semiconductor laser.

In one or more embodiments, the photonic integrated circuit 100 may include a heat sink 128. The heat sink 128 may be positioned to assist in dissipating heat from the laser 120. In one or more embodiments, the heat sink 128 may be positioned such that the heat sink 128 is in contact (e.g., direct contact) with the laser 120. For example, the heat sink 128 may be positioned or provided in the substrate 110 adjacent to the laser 120 by any suitable methods or processes such as, e.g., deposition or growing process, "pick and place" method, etc. Specifically, in one or more embodiments, the heat sink 128 may be deposited as a patterned layer of copper or any other suitable material. In one or more embodiments, the heat sink 128 may be grown in the substrate 110 (e.g., the device layer 114) and the laser 120 may be placed or positioned thereon.

Figure 2:
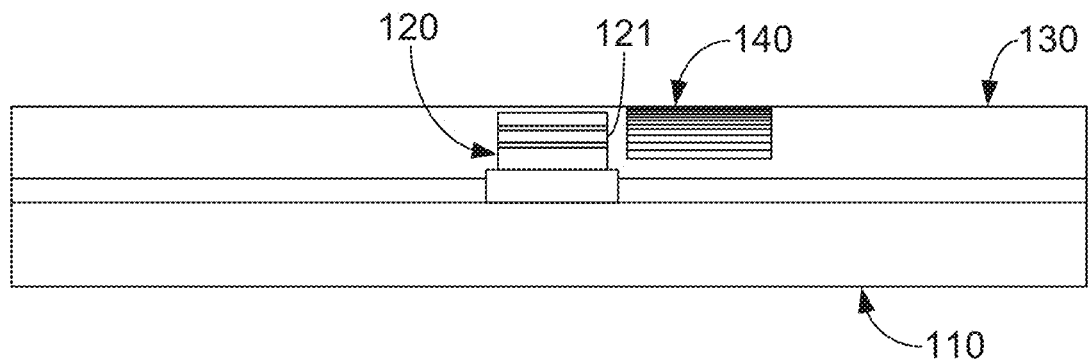

As shown in FIG. 2, the photonic integrated circuit 100 may also include a first cladding layer 130. For example, the first cladding layer 130 may be positioned or provided on the substrate 110 and surrounding the laser 120. It is noted that, surrounding the laser 120 may include on top of the laser 120 and/or encompassing the laser 120 such that the laser 120 may be located within the first cladding layer 130. As such, it may be described that the laser 120 is integrated or within the photonic integrated circuit 100 (e.g., an integrated laser). It is further noted that, because the laser 120 may be provided on the substrate 110, a surface of the laser 120 that is adjacent or contacting the substrate may not be covered by the first cladding layer 130, but the laser 120 may still be considered surrounded by the first cladding layer 130. The first cladding layer 130 may be provided or formed using any suitable methods or techniques, e.g., deposition or growing processes, etc. Further, the first cladding layer 130 may include (e.g., be formed of) silicon and one or more materials such as, e.g., oxide and/or nitride materials (e.g., SiN, SiO, SiON, etc.), etc.

In one or more embodiments, the first cladding layer 130 may define or form cavities extending at least partially into the first cladding layer 130. The cavities may be defined using any suitable method or technique such as, e.g., mechanical drilling, laser drilling, etching, etc. The cavities may provide a space for devices or components (e.g., lasers, modulators, photodetectors, etc.) to be placed or positioned therein. For example, in one or more embodiments, the devices or components (e.g., the laser 120) may be positioned (e.g., mechanically placed) within the cavities using any suitable methods or techniques, e.g., "pick and place" method, transfer printing, etc. The cavities may extend from a surface of the first cladding layer 130 (e.g., into the first cladding layer 130) any suitable depth or thickness such that the device or component may be positioned therein. Further, it is noted that cavities may be defined in any suitable layer described herein during the manufacturing process of the photonic integrated circuit 100 (e.g., to position devices or components therein).

The photonic integrated circuit 100 may further include a laser optical coupler 140 aligned with (e.g., adjacent to) an output 121 of the laser 120, as shown in FIG. 2. The laser optical coupler 140 may be formed in the first cladding layer 130 using any suitable methods or techniques, e.g., deposition or growing processes, etc. Further, the laser optical coupler 140 may include (e.g., be formed of) silicon and one or more materials such as, e.g., oxide and/or nitride materials (e.g., SiN, SiO, SiON, etc.), etc. Often, the coupler material and the cladding material may be different to achieve the desired coupling. The laser optical coupler 140 may be aligned with the output 121 of the laser 120 such that optical signals generated and emitted by the laser 120 efficiently and effectively couple the optical signals with an optical waveguide 150 described further herein.

In one or more embodiments, the laser optical coupler 140 may define any suitable characteristics or specifications. For example, laser optical coupler 140 may define a graded index to assist in coupling optical signals from the laser 120 and into the optical waveguide 150. In one or more embodiments, the laser optical coupler 140 may define multiple layers ranging in refractive index. For example, the laser optical coupler 140 may define a refractive index from about 1.72 at the top (e.g., proximate the optical waveguide 150) to about 1.63 at the bottom (e.g., proximate the output 121 of the laser 120). Specifically, the multiple layers of the laser optical coupler 140 may include multiple layers at the top that are thinner than layers at the bottom (and, e.g., multiple layers at the bottom that are thicker than the top). Further, the laser optical coupler 140 may define a total thickness of about 3 micrometers to 6 micrometers. Specifically, the laser optical coupler 140 may define a total thickness of about 4.6 micrometers. The laser optical coupler 140 may include any number of suitable layers. For example, the laser optical coupler 140 may include about 25 to 50 layers. Further, in one or more embodiments, the laser optical coupler 140 may define a coupler efficiency of about 45%.

Figure 3:
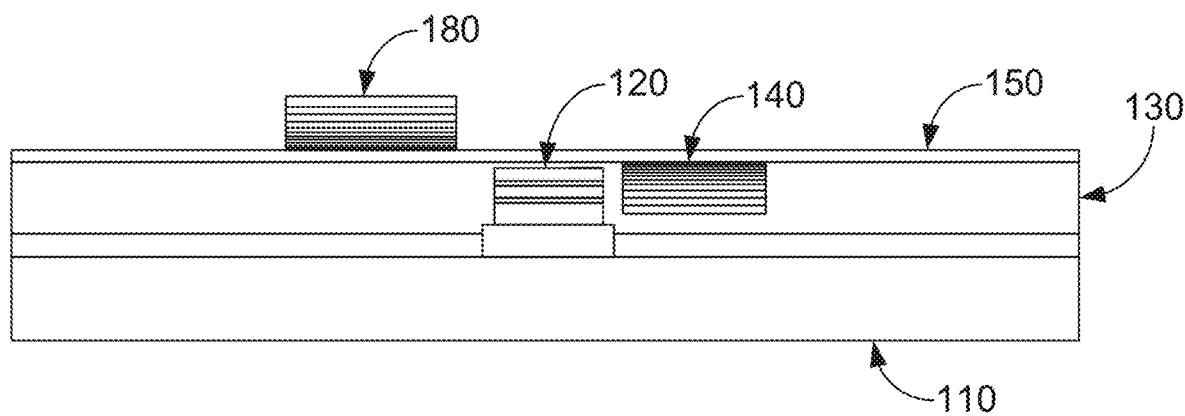

As shown in FIG. 3, the photonic integrated circuit 100 may also include an optical waveguide 150 positioned or provided on the first cladding layer 130. The optical waveguide 150 may be positioned such that the optical waveguide 150 is in optical communication with the laser optical coupler 140. Therefore, optical signals from the laser 120 may be emitted through the laser optical coupler 140 to the optical waveguide 150 (e.g., due to a graded index of the laser optical coupler 140). The optical waveguide 150 may be provided or formed using any suitable methods or techniques, e.g., deposition or growing processes, etc. Further, the optical waveguide 150 may include (e.g., be formed of) silicon and one or more materials such as, e.g., oxide and/or nitride materials (e.g., SiN, SiO, SiON, etc.), etc. Further, the waveguide 150 may include any suitable structure (e.g., silicon-based structures) for guiding optical signals.

Furthermore, mechanically placing (e.g., "pick and place," transfer printing, etc.) the lasers 120, on or in a substrate as described herein, may result in a gap, or space, of less than or equal to 500 nanometers, less than or equal to 300 nanometers, and/or less than or equal to 100 nanometers between the laser 120 and silicon components (e.g., between the output 121 of the laser 120 and an input of the laser optical coupler 140 or optical waveguide 150). In other words, the methods described herein may include positioning a III-V compound semiconductor (e.g., the laser 120) proximate silicon components such that the gap therebetween may be less than or equal to 500 nanometers (e.g., tightly integrated). Gaps of less than or equal to 500 nanometers may increase performance such as, e.g., lower power consumption and/or faster response times as compared to methods and apparatus that result in gaps greater than 500 nanometers. In general, other methods of making and apparatus using semiconductor lasers (such as III-V compound semiconductor lasers) integrated with silicon substrates and/or optical couplers/inputs/outputs formed of silicon may result in gaps larger than 500 nanometers between them (e.g., greater than 1 micrometer). For example, semiconductor lasers may be grown in situ with silicon substrates and other silicon structures (e.g., silicon-based structures), and such processes may result in gaps larger than 500 nanometers between them (e.g., greater than 1 micrometer).

The photonic integrated circuit 100 may also include a connecting optical coupler 180. For example, the connecting optical coupler 180 may be provided or positioned on the optical waveguide 150, as shown in FIG. 3. The connecting optical coupler 180 may be provided or formed using any suitable methods or techniques, e.g., deposition or growing processes, etc. Further, the connecting optical coupler 180 may include (e.g., be formed of) silicon and one or more materials such as, e.g., oxide and/or nitride materials (e.g., SiN, SiO, SiON, etc.), etc. Often, the coupler material and the cladding material may be different to achieve the desired coupling. In one or more embodiments, the connecting optical coupler 180 may be provided and include materials similar to that of laser optical coupler 140. Further, the connecting optical coupler 180 and the laser optical coupler 140 may include any suitable structure (e.g., silicon-based structures) for guiding optical signals, e.g., waveguides, optical splitters, optical gratings, evanescent structures, etc.

Figure 9:
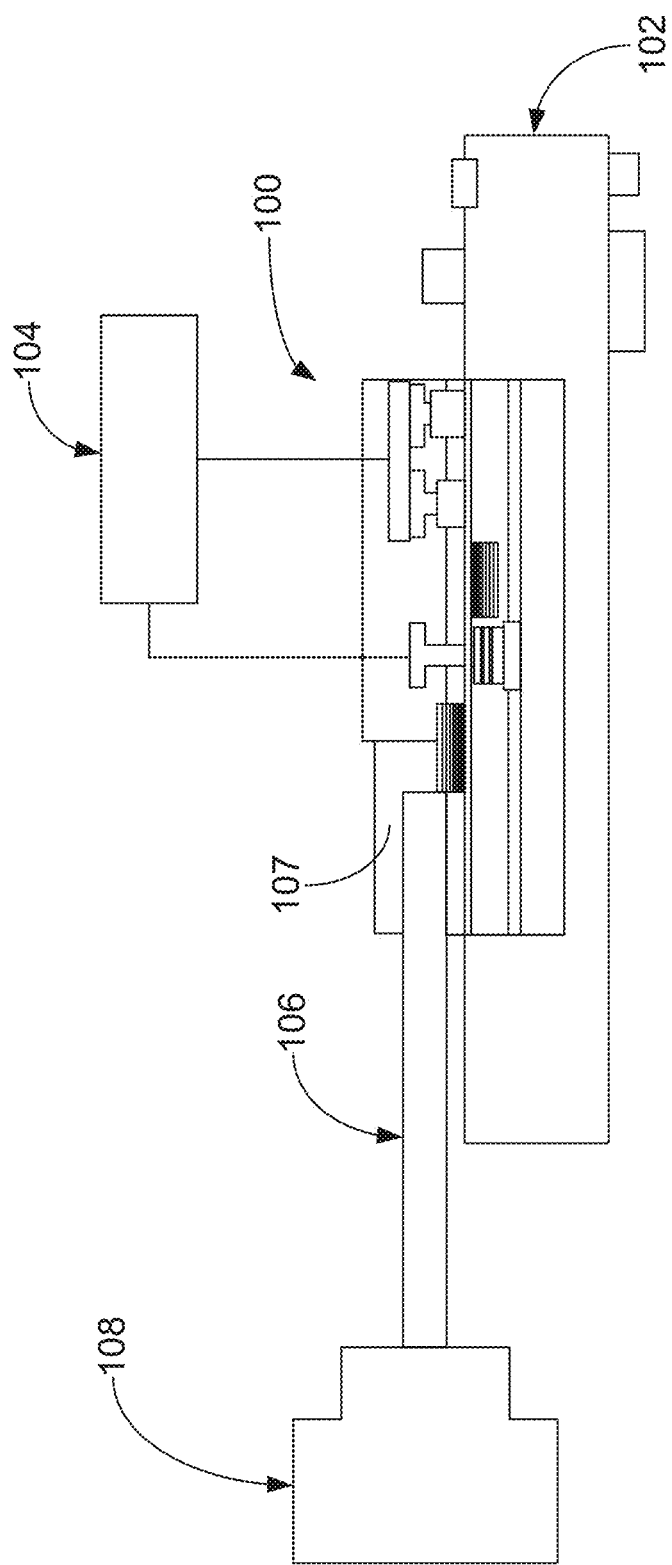
FIG. 9 is a cross-sectional schematic diagram of the photonic integrated circuit of FIG. 8 operably coupled to a printed circuit board and an optical connector.

Specifically, the connecting optical coupler 180 may be positioned on the optical waveguide 150 such that the connecting optical coupler 180 is in optical communication with the optical waveguide 150. Furthermore, as described further herein, an optical fiber 106 (e.g., as shown in FIG. 9) may be optically coupled with the connecting optical coupler 180 such that optical signals transmitted through the optical fiber 106 may proceed through the connecting optical coupler 180 to the optical waveguide 150. The connecting optical coupler 180 may define any suitable characteristics or specifications, e.g., similar to those of the laser optical coupler 140. For example, connecting optical coupler 180 may define a graded index to assist in coupling optical signals through the connecting optical coupler 180 and into the optical waveguide 150.

Figure 4:
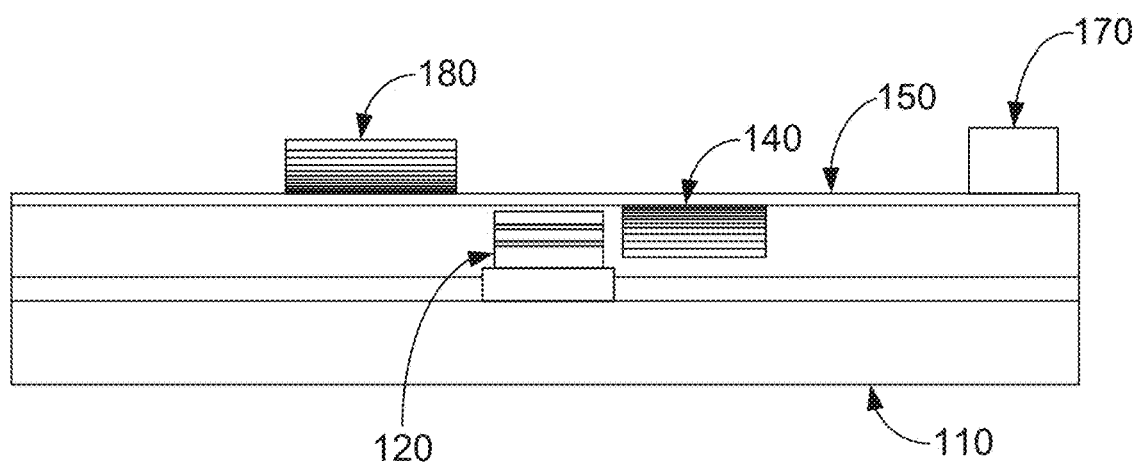

The photonic integrated circuit 100 may further include a photodetector 170 as shown in FIG. 4. The photodetector 170 may be placed or positioned (e.g., mechanically placed) relative to (or on) the optical waveguide 150 by any suitable methods or processes. For example, placing the photodetector 170 on the optical waveguide 150 may include using a "pick and place" method, a transfer printing method, etc. In one or more embodiments, the photodetector 170 may be placed on the optical waveguide 150 by transfer printing the photodetector 170 from a photodetector wafer to the optical waveguide 150 (e.g., similar to as described herein with regards to transfer printing lasers).

The photodetector 170 may be positioned such that the photodetector 170 may be in optical communication with the optical waveguide 150 to, e.g., detect optical signals in the optical waveguide 150. For example, the photodetector 170 may receive optical signals transmitted through the optical waveguide 150 to convert the optical signals to electrical signals. In one or more embodiments, the photodetector 170 may detect optical signals transmitted from the connecting optical coupler 180 via the optical waveguide 150 (e.g., from an optical fiber 106 optically connected to the connecting optical coupler 180).

The photodetector 170 may include any of a variety of different types of photodetectors. For example, in one or more embodiments, the photodetector 170 may include p-i-n photodetectors, metal-semiconductor-metal (MSM) photodiodes, avalanche photodiodes (APD), etc. Further, the photodetector 170 may define any suitable characteristics or specifications (e.g., responsivity). In one or more embodiments, the photodetector 170 may include or be formed of any III-V compound semiconductors such as, e.g., gallium arsenide, indium phosphate, gallium phosphate, gallium nitride, indium gallium arsenide, etc. In other words, the photodetector 170 may be, or be referred to as, a III-V compound semiconductor photodetector.

Figure 5:
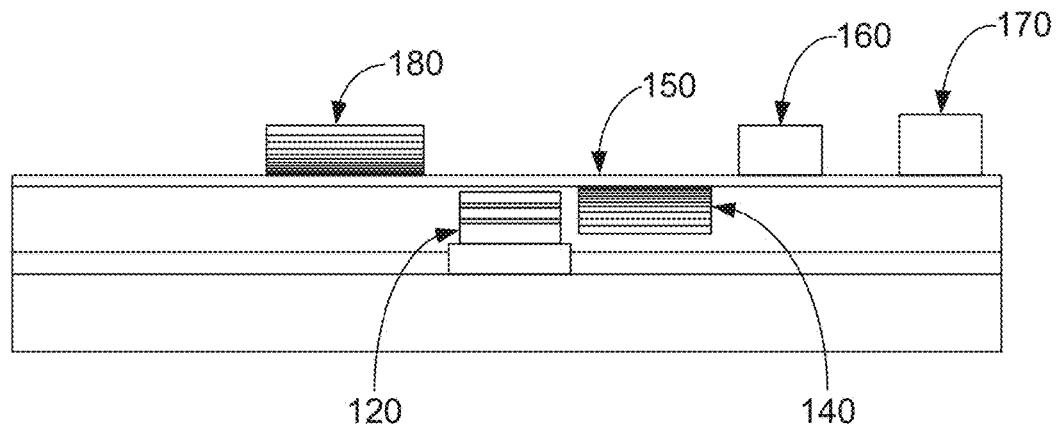

Additionally, the photonic integrated circuit 100 may include a modulator 160 as illustrated in FIG. 5. The modulator 160 may be placed or positioned (e.g., mechanically placed) relative to (or on) the optical waveguide 150 by any suitable methods or processes. For example, placing the modulator 160 on the optical waveguide 150 may include using a "pick and place" method, a transfer printing method, etc. In one or more embodiments, the modulator 160 may be placed on the optical waveguide 150 by transfer printing the modulator 160 from a modulator wafer to the optical waveguide 150 (e.g., similar to as described herein with regards to transfer printing lasers).

The modulator 160 may be positioned such that the modulator 160 may be in optical communication with the optical waveguide 150 to, e.g., modulate optical signals in the optical waveguide 150. For example, the modulator 160 may receive optical signals from the laser 120 through the optical waveguide 150. Thereafter, the optical signals may be modulated or modified by the modulator 160 (e.g., based on an electrical signal transmitted to the modulator 160) and output therefrom. Therefore, the modulator 160 may be adapted to convert electrical signals to optical signals.

The modulator 160 may include any of a variety of different types of modulators. For example, in one or more embodiments, the modulator 160 may include carrier injection modulators, carrier depletion modulators, metal-oxide semiconductor modulators, quantum well modulators, mach-zender interferometer modulators, etc. Further, the modulator 160 may define any suitable characteristics or specifications (e.g., bandwidth, sensitivity, etc.). In one or more embodiments, the modulator 160 may include or be formed of any III-V compound semiconductors such as, e.g., gallium arsenide, indium phosphate, gallium phosphate, gallium nitride, etc. In other words, the modulator 160 may be, or be referred to as, a III-V compound semiconductor modulator.

The modulator 160 may be positioned relative to the photodetector 170 in any suitable way. The modulator 160 may be positioned proximate the photodetector 170, with both the modulator 160 and the photodetector 170 optically coupled to the optical waveguide 150. Specifically, as shown in FIG. 5, the photodetector 170 is located optically downstream of the modulator 160, along the optical waveguide 150, relative to optical signals emitted from the laser 120. However, other relative positioning of the photodetector 170 and the modulator 160 are contemplated herein.

Furthermore, mechanically placing (e.g., "pick and place," transfer printing, etc.) the photodetectors 170 and/or modulators 160, on or in a substrate as described herein, may result in a gap, or space, of less than or equal to 500 nanometers, less than or equal to 300 nanometers, and/or less than or equal to 100 nanometers between the photodetector 170/modulator 160 and silicon components (e.g., between the photodetector 170/modulator 160 and the optical waveguide 150 or an optical coupler). In other words, the methods described herein may include positioning a III-V compound semiconductor (e.g., the photodetector 170, the modulator 160, etc.) proximate silicon components such that the gap therebetween may be less than or equal to 500 nanometers. Gaps of less than or equal to 500 nanometers may increase performance such as, e.g., lower power consumption and/or faster response times as compared to methods and apparatus that result in gaps greater than 500 nanometers. In general, other methods of making and apparatus using semiconductor photodetectors/modulators (such as III-V compound semiconductor photodetectors/modulators) integrated with silicon substrates and/or optical couplers/inputs/outputs formed of silicon may result in gaps larger than 500 nanometers between them (e.g., greater than 1 micrometer). For example, semiconductor photodetectors/modulators may be grown in situ with silicon substrates and other silicon structures (e.g., silicon-based structures), and such processes may result in gaps larger than 500 nanometers between them (e.g., greater than 1 micrometer).

Figure 6:
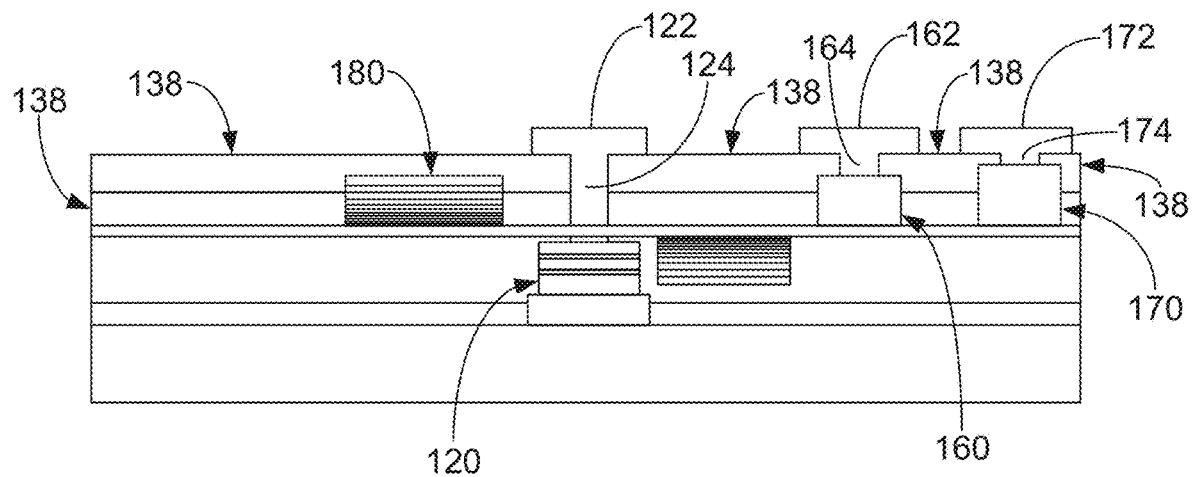

As shown in FIG. 6, the photonic integrated circuit 100 may include a second cladding layer 138. For example, the second cladding layer 138 may be provided on the optical waveguide 150 and surrounding at least one of the connecting optical coupler 180, the modulator 160, and the photodetector 170. As such, the connecting optical coupler 180, the modulator 160, and the photodetector 170 may be described as within the second cladding layer 138 and/or integrated within the photonic integrated circuit 100. Further, the connecting optical coupler 180 may be formed in the second cladding layer 138 using any suitable methods or techniques.

The second cladding layer 138 may be provided or formed using any suitable methods or techniques, e.g., deposition or growing processes, etc. Further, the second cladding layer 138 may include (e.g., be formed of) silicon and one or more materials such as, e.g., oxide and/or nitride materials (e.g., SiN, SiO, SiON, etc.), etc. The second cladding layer 138 may be the same as or different from the first cladding layer 130 (or, e.g., any other cladding layer described herein). For example, each of the different cladding layers may define different refractive indices.

Also, as shown in FIG. 6, the photonic integrated circuit 100 may include a laser contact 122 electrically coupled to the laser 120, a modulator contact 162 electrically coupled to the modulator 160, and a photodetector contact 172 electrically coupled to the photodetector 170. For example, the laser contact 122, the modulator contact 162, and the photodetector contact 172 may provide an electrical contact for each of the laser 120, the modulator 160, and the photodetector 170, respectively. Further, the laser contact 122, the modulator contact 162, and the photodetector contact 172 may be positioned or provided (e.g., mechanically placed) on the second cladding layer 128 by any suitable methods or processes. Specifically, placing the laser contact 122, the modulator contact 162, and the photodetector contact 172 on the second cladding layer 128 may include using a "pick and place" method, a transfer printing method, etc.

Additionally, the photonic integrated circuit 100 may include a laser interconnect 124 between the laser 120 and the laser contact 122, a modulator interconnect 164 between the modulator 160 and the modulator contact 162, and a photodetector interconnect 174 between the photodetector 170 and the photodetector contact 172 as illustrated in FIG. 6. Each of the interconnects (e.g., the laser interconnect 124, the modulator interconnect 164, and the photodetector interconnect 174) may provide an electrical conduit through which an electrical signal may be transmitted between the component and the component contact. The interconnects 124, 164, 174 may provide power improvements due to the short electrical length and may remove the need for wirebonding.

Further, each of the laser interconnect 124, the modulator interconnect 164, and the photodetector interconnect 174 may be provided or formed (e.g., through the second cladding layer 138) using any suitable methods or techniques. Further yet, the laser interconnect 124, the modulator interconnect 164, and the photodetector interconnect 174 may include (e.g., be formed of) one or more materials such as, e.g., metallics. Specifically, the interconnects may include copper. In one or more embodiments, the interconnects 124, 164, 174 may be provided or formed prior to the contacts 122, 162, 172 being placed or positioned (e.g., on the second cladding layer 138).

Figure 7:
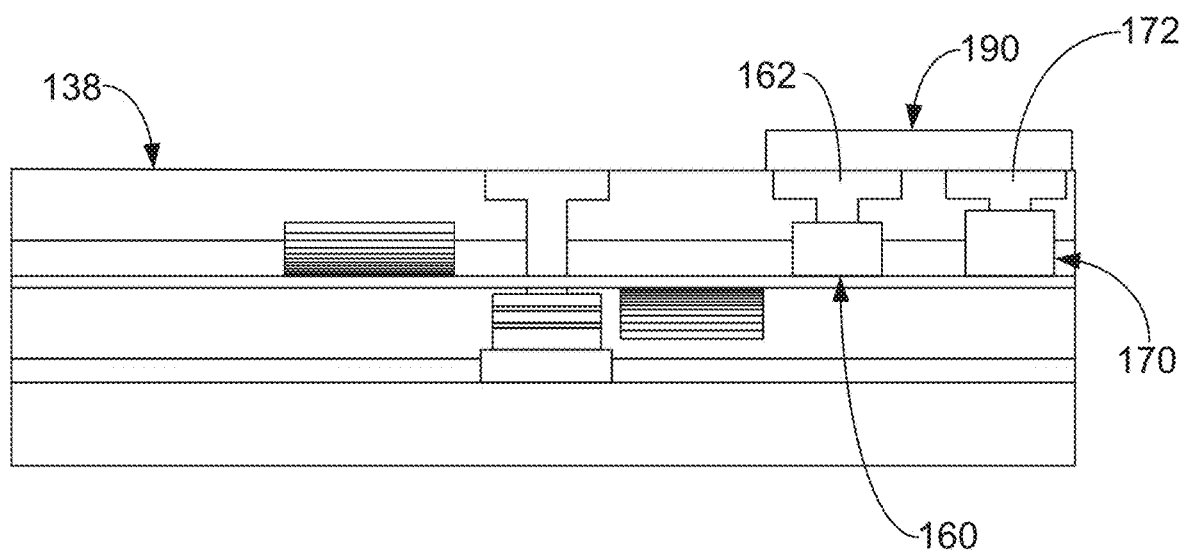

In one or more embodiments, the photonic integrated circuit 100 may further include an integrated controller 190 (e.g., a silicon chip) including one or more processors in contact (e.g., direct contact) with each of the modulator contact 162 and the photodetector contact 172 as shown in FIG. 7. For example, the integrated controller 190 may be electrically coupled to each of the modulator contact 162 and the photodetector contact 172 to assist in operating the modulator 160 and the photodetector 170, respectively. Specifically, the integrated controller 190 may assist in sending electrical signals to the modulator 160 to modulate optical signals emitted from the laser 120 into the optical waveguide 150 and may assist in converting optical signals received by the photodetector 170 to electrical signals or amplifying those signals.

The integrated controller 190 may be placed or positioned (e.g., mechanically placed) on the modulator contact 162 and the photodetector contact 172 by any suitable methods or processes. For example, placing the integrated controller 190 on the contacts 162, 172 may include using a "pick and place" method, a transfer printing method, etc.

Figure 8:
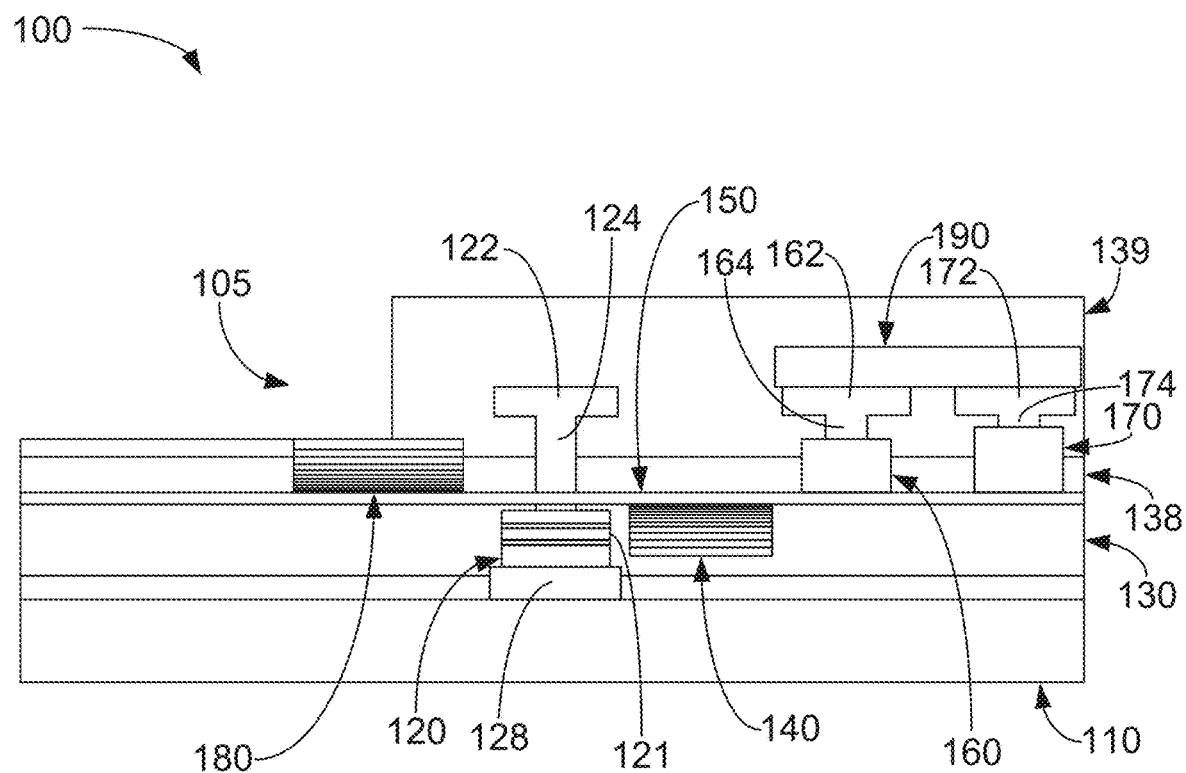

As shown in FIG. 8, the photonic integrated circuit 100 may further include a third cladding layer 139. The third cladding layer 139 may be provided on the second cladding layer 138 and surrounding (e.g., including on top of) the integrated controller 190. For example, the integrated controller 190 may be described as integrated because the integrated controller may be within the third cladding layer 139 and/or integrated into the photonic integrated circuit 100. Further, the third cladding layer 139 may also surround the laser contact 122, the modulator contact 162, and the photodetector contact 172. The third cladding layer 139 may be provided or formed using any suitable methods or techniques, e.g., deposition or growing processes, etc. Also, the third cladding layer 139 may include (e.g., be formed of) silicon and one or more materials such as, e.g., oxide and/or nitride materials (e.g., SiN, SiO, SiON, etc.), etc. In one or more embodiments, the cladding layer (e.g., first, second, or third cladding layer 130, 138, 139) may also function as an electrical insulator.

It is noted that the photonic integrated circuit 100 may be fabricated as an array of photonic integrated circuits. After the third cladding layer 139 is deposited, the photonic integrated circuit 100 may be separated or singulated (e.g., from the array) to form individual photonic integrated circuits 100. In one or more embodiments, the photonic integrated circuits 100 may be tested. Additional components may then be added to the photonic integrated circuit 100 to form an integrated transceiver.

In one or more embodiments, the third cladding layer 139 of the photonic integrated circuit 100 may define a v-groove 105 adapted to receive an optical fiber 106 (e.g., as shown in FIG. 9). The v-groove 105 may be shaped and positioned such that the optical fiber 106 may be optically coupled and aligned with the connecting optical coupler 180. Therefore, the optical fiber 106 may be in optical communication with the optical waveguide 150 (e.g., through the connecting optical coupler 180). The v-groove 105 may be defined in the third cladding layer 139 using any suitable methods or techniques, e.g., etching, mechanical drilling, laser drilling, etc. In one or more embodiments, the v-groove 105 may define a width of about 120 micrometers to about 170 micrometers and a depth of about 50 micrometers to about 100 micrometers. Specifically, the v-groove 105 may define a width of about 145 micrometers and a depth of about 75 micrometers.

Furthermore, the optical fiber 106 may be aligned and attached to the photonic integrated circuit 100 using any suitable methods or techniques, e.g., adhesives, etc. Further, the optical fiber 106 may be positioned on the photonic integrated circuit 100 in any suitable way such as, e.g., pick-and-place, and placed quickly into grooves in the photonic integrated circuit 100. As shown in FIG. 9, the optical fiber 106 may be attached to the photonic integrated circuit 100 using an epoxy 107. In one or more embodiments, the optical fiber 106 may extend between the connecting optical coupler 180 and an optical connector 108. The optical connector 108 may assist in connecting the photonic integrated circuit 100 to an optical source (e.g., through the optical fiber 106). The optical connector 108 may be any suitable connector known in the art.

Also, as shown in the FIG. 9, the photonic integrated circuit 100 may be mounted on a printed circuit board 102. The printed circuit board 102 may facilitate or enable power connections and input/output connections to the photonic integrated circuit 100. For example, the substrate 110 of the photonic integrated circuit 100 may be coupled to the printed circuit board 102 using any suitable method or technique. Furthermore, the optical waveguide 150 may be operably coupled with the printed circuit board 102 to provide an output for optical signals. For example, optical signals may pass from the optical waveguide 150 and into the printed circuit board 102. The optical signals may then pass through the printed circuit board 102 to an external connector operably coupled to the printed circuit board 102. The photonic integrated circuit 100 combined with the printed circuit board 102 and the optical fiber 106 may be described as a transceiver. Further yet, the transceiver may be coupled within a known pluggable form factor (e.g., a quad small form-factor pluggable (QSFP), quad small form-factor pluggable-double density (QSFP-DD), C form factor pluggable (CFP), octal small form factor pluggable (OSFP), etc.).

Further, a transceiver controller 104 may be operably coupled to the photonic integrated circuit 100. It is noted that the transceiver controller 104 is represented schematically in FIG. 9, but may be included on the printed circuit board 102. The transceiver controller 104 may include one or more processors to control the photonic integrated circuit 100 (e.g., through the laser contact 122 and the integrated controller 190) in converting between optical signals and electric signals.

The components of the photonic integrated circuit 100 may be arranged in any suitable way that maintains the function of the photonic integrated circuit 100. As illustrated herein, the laser 120 may be positioned between the connecting optical coupler 180 and the laser optical coupler 140 relative to a length of the optical waveguide 150. However, various arrangements of the integrated components are contemplated herein.

The methods and/or logic described in this disclosure, including those attributed to the photonic integrated circuit 100, or various constituent components (e.g., the transceiver controller 104 and/or the integrated controller 190), may be implemented, at least in part, in hardware, software, firmware, or any combination thereof. For example, various aspects of the techniques may be implemented within one or more processors, including one or more microprocessors, microcontrollers, DSPs, ASICs, FPGAs, or any other equivalent integrated or discrete logic circuitry, as well as any combinations of such components, or other devices. The term "processor" or "processing circuitry" may generally refer to any of the foregoing logic circuitry, alone or in combination with other logic circuitry, or any other equivalent circuitry. Such hardware, software, and/or firmware may be implemented within the same system or within separate systems to support the various operations and functions described in this disclosure. In addition, any of the described components may be implemented together or separately as discrete but interoperable logic devices.

When implemented in software, the functionality ascribed to the systems, devices and methods described in this disclosure may be embodied as instructions and/or logic on a computer-readable medium such as RAM, ROM, NVRAM, EEPROM, FLASH memory, magnetic data storage media, optical data storage media, or the like. The instructions and/or logic may be executed by one or more processors to support one or more aspects of the functionality described in this disclosure.

Therefore, as described herein, the laser 120 may be integrated within the photonic integrated circuit 100 (e.g., using a transfer printing process). As such, the laser 120 as described herein may not be coupled to the photonic integrated circuit 100 upon fabrication of the remainder of the photonic integrated circuit 100, e.g., such that a laser is in a separate package that is attached to an external surface of the photonic integrated circuit 100 and not grown in situ. In one or more embodiments, semiconductor lasers/photodetectors/modulators may be grown using III-V semiconductor deposition techniques that may not be compatible with silicon deposition techniques of the substrate 110 and the included optical waveguides 150 and couplers 140, 180. Thus, the semiconductor lasers/photodetectors/modulators may be grown separately from the silicon substrates and structures (e.g., silicon-based structures) therein. Then, using methods described herein (e.g., mechanical placement such as pick-and-place, transfer printing, etc.), semiconductor lasers/photodetectors/modulators grown using III-V semiconductor deposition techniques may be integrated (e.g., tightly integrated) with silicon substrates resulting in a gap between the semiconductor laser/photodetector/modulator and the optical waveguides/couplers such as, e.g., less than or equal to 500 nanometers, less than or equal to 300 nanometers, and/or less than or equal to 100 nanometers. Gaps of less than or equal to 500 nanometers, less than or equal to 300 nanometers, and/or less than or equal to 100 nanometers may allow for less power to be used and faster response times than methods and apparatus that result in larger gaps.

In the preceding description, reference is made to the accompanying set of drawings that form a part hereof and in which are shown by way of illustration several specific embodiments. It is to be understood that other embodiments are contemplated and may be made without departing from (e.g., still falling within) the scope or spirit of the present disclosure. The preceding detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise. As used herein, "or" is generally employed in its sense including "and/or" unless the content clearly dictates otherwise. As used herein, "have," "having," "include," "including," "comprise," "comprising," or the like are used in their open-ended sense, and generally mean "including, but not limited to."

Terms related to orientation, such as "top," "bottom," "side," and "end," are used to describe relative positions of components and are not meant to limit the orientation of the embodiments contemplated. These terms should not be construed as limiting the position or orientation of a structure, but should be used as providing spatial relationship between the structures.

Embodiments of the systems, photonic integrated circuits, integrated transceivers, and methods associated therewith are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. An apparatus comprising:
   a substrate;
   a III-V compound semiconductor laser positioned on the substrate and adapted to output optical signals;
   a first cladding layer positioned on the substrate and surrounding the integrated laser;
   a laser optical coupler comprising silicon, positioned within the first cladding layer, and aligned with the integrated laser to receive the optical signals; and
   an optical waveguide positioned on the first cladding layer and in optical communication with the laser optical coupler.

2. The apparatus of claim 1, wherein an output of the laser is spaced apart from the laser optical coupler by a gap of less than or equal to 500 nanometers.

3. The apparatus of claim 1, further comprising a modulator optically coupled to the optical waveguide to modulate optical signals in the optical waveguide.

4. The apparatus of claim 1, further comprising:
   a connecting optical coupler optically coupled to the optical waveguide to guide optical signals from an optical fiber and into the optical waveguide; and
   a photodetector optically coupled to the optical waveguide to detect optical signals in the optical waveguide.

5. The apparatus of claim 1, further comprising:
   a photodetector optically coupled to the optical waveguide to detect optical signals in the optical waveguide;
   a photodetector contact electrically coupled to the photodetector;
   a modulator optically coupled to the optical waveguide to modulate the optical signals in the optical waveguide;
   a modulator contact electrically coupled to the modulator;
   a controller comprising one or more processors and electrically coupled to the photodetector contact and the modulator contact.

6. A system comprising:
   a printed circuit board;
   a photonic integrated circuit operably coupled to the printed circuit board, the photonic integrated circuit comprising:
      a substrate,
      an integrated laser mechanically placed on the substrate and adapted to output optical signals,
      a laser optical coupler aligned with the integrated laser to receive the optical signals and spaced apart from an output of the laser by a gap distance of less than or equal to 500 nanometers, and
      an optical waveguide positioned in optical communication with the laser optical coupler; and
   an optical fiber operably coupled to the photonic integrated circuit and in optical communication with the optical waveguide.

7. The system of claim 6, wherein the laser comprises a III-V compound semiconductor and the laser optical coupler comprises silicon.

8. The system of claim 6, wherein the integrated laser is mechanically placed on the substrate via transfer printing.

9. The system of claim 6, further comprising a modulator optically coupled to the optical waveguide to modulate optical signals in the optical waveguide.

10. The system of claim 6, further comprising:
    a connecting optical coupler optically coupled to the optical waveguide to guide optical signals from the optical fiber and into the optical waveguide; and
    a photodetector optically coupled to the optical waveguide to detect the optical signals in the optical waveguide.

11. The system of claim 6, further comprising:
    a photodetector optically coupled to the optical waveguide to detect optical signals in the optical waveguide;
    a photodetector contact electrically coupled to the photodetector;
    a modulator optically coupled to the optical waveguide to modulate the optical signals in the optical waveguide;
    a modulator contact electrically coupled to the modulator;
    a controller comprising one or more processors and electrically coupled to the photodetector contact and the modulator contact.

12. A method comprising:
    providing a substrate;
    placing a laser on the substrate;
    depositing a first cladding layer on the substrate and surrounding the laser, the first cladding layer comprising a laser optical coupler aligned with an output of the laser; and
    depositing an optical waveguide on the first cladding layer such that the optical waveguide is in optical communication with the laser optical coupler.

13. The method of claim 12, wherein the output of the laser is spaced apart from the laser optical coupler by a gap of less than or equal to 500 nanometers.

14. The method of claim 12, wherein placing the laser on the substrate comprises transfer printing the laser from a laser wafer to the substrate.

15. The method of claim 14, wherein transfer printing the laser from the laser wafer to the substrate comprises:
    delineating the laser on the laser wafer by etching;
    contacting the laser wafer with a print pad coated with a print pad adhesive;
    actuating the print pad to transfer the laser from the laser wafer to the print pad;
    printing the laser on the substrate; and
    actuating the print pad to transfer the laser from the print pad to the substrate.

16. The method of claim 12, further comprising:
    placing a modulator on the optical waveguide to modulate optical signals in the optical waveguide; and
    placing a photodetector on the optical waveguide to detect the optical signals in the optical waveguide.

17. The method of claim 16, wherein placing the photodetector on the optical waveguide comprises transfer printing the photodetector from a photodetector wafer to the optical waveguide.

18. The method of claim 16, wherein placing the modulator on the optical waveguide comprises transfer printing the modulator from a modulator wafer to the optical waveguide.

19. The method of claim 16, further comprising:

depositing a second cladding layer on the optical waveguide and surrounding the photodetector and the modulator;

placing a laser contact, a modulator contact, and a photodetector contact on the second cladding layer; and providing a laser interconnect between the laser and the laser contact, a modulator interconnect between the modulator and the modulator contact, and a photodetector interconnect between the photodetector and the photodetector contact.

20. The method of claim 12, further comprising fabricating the laser on a laser wafer before placing the laser on the substrate.

* * * * *